United States Patent
Milligan

(10) Patent No.: US 7,713,874 B2
(45) Date of Patent: May 11, 2010

(54) PERIODIC PLASMA ANNEALING IN AN ALD-TYPE PROCESS

(75) Inventor: Robert B. Milligan, Gold Canyon, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 11/743,574

(22) Filed: May 2, 2007

(65) Prior Publication Data

US 2008/0274617 A1 Nov. 6, 2008

(51) Int. Cl.
*H01L 21/44* (2006.01)
(52) U.S. Cl. ............... 438/680; 438/656; 438/681; 438/686; 438/687; 257/E21.17; 257/E21.295; 257/E21.3; 257/E21.101; 257/E21.168; 117/103; 117/104; 427/585; 427/255.28
(58) Field of Classification Search ............... 438/507, 438/509, 660, 681, 685, 686, 687, 688, 761, 438/785, 656, 680; 257/E21.17, E21.101, 257/E21.168, E21.196, E21.2, E21.269, E21.294, 257/E21.295, E21.478, E21.485, E21.3; 117/102, 117/103, 104, 105; 427/576, 585, 255.28
See application file for complete search history.

(56) References Cited

U.S. PATENT DOCUMENTS

| 3,708,728 A | 1/1973 | Sterling et al. |
| 4,058,430 A | 11/1977 | Suntola et al. |
| 4,085,430 A | 4/1978 | Gerkema et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |

(Continued)

FOREIGN PATENT DOCUMENTS

EP 0394054 4/1989

(Continued)

OTHER PUBLICATIONS

U.S. Appl. No. 10/242,368, filed Sep. 12, 2002; Office Actions sent Oct. 20, 2004, Apr. 27, 2004, and Nov. 29, 2005; Notice of Allowance Jul. 14, 2005.

(Continued)

*Primary Examiner*—Julio J Maldonado
(74) *Attorney, Agent, or Firm*—Knobbe, Martens, Olson & Bear, LLP

(57) ABSTRACT

Methods for performing periodic plasma annealing during atomic layer deposition are provided along with structures produced by such methods. The methods include contacting a substrate with a vapor-phase pulse of a metal source chemical and one or more plasma-excited reducing species for a period of time. Periodically, the substrate is contacted with a vapor phase pulse of one or more plasma-excited reducing species for a longer period of time. The steps are repeated until a metal thin film of a desired thickness is formed over the substrate.

37 Claims, 3 Drawing Sheets

U.S. PATENT DOCUMENTS

| | | | |
|---|---|---|---|
| 5,270,247 A | 12/1993 | Sakuma et al. | |
| 5,281,274 A | 1/1994 | Yoder | |
| 5,306,666 A | 4/1994 | Izumi | |
| 5,316,793 A | 5/1994 | Wallace et al. | |
| 5,342,652 A | 8/1994 | Foster et al. | |
| 5,356,673 A | 10/1994 | Schmitt et al. | |
| 5,438,028 A | 8/1995 | Weissman et al. | |
| 5,443,647 A | 8/1995 | Aucoin et al. | |
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |
| 5,744,254 A | 4/1998 | Kampe et al. | |
| 5,769,950 A | 6/1998 | Takasu et al. | |
| 5,789,024 A | 8/1998 | Levy et al. | |
| 5,855,680 A | 1/1999 | Soininen | |
| 5,916,365 A | 6/1999 | Sherman | |
| 5,946,598 A | 8/1999 | Yeh | |
| 5,961,365 A | 10/1999 | Lambert | |
| 5,964,943 A | 10/1999 | Stein et al. | |
| 5,965,004 A | 10/1999 | Cowley et al. | |
| 5,972,430 A | 10/1999 | DiMeo et al. | |
| 5,973,400 A | 10/1999 | Murakami et al. | |
| 6,006,763 A | 12/1999 | Mori et al. | |
| 6,015,590 A | 1/2000 | Suntola et al. | |
| 6,087,257 A | 7/2000 | Park et al. | |
| 6,099,904 A | 8/2000 | Mak et al. | |
| 6,104,074 A | 8/2000 | Chen | |
| 6,113,977 A | 9/2000 | Soininen et al. | |
| 6,139,700 A | 10/2000 | Kang et al. | |
| 6,156,382 A | 12/2000 | Rajagopalan et al. | |
| 6,162,501 A | 12/2000 | Kim | |
| 6,188,134 B1 | 2/2001 | Stumborg et al. | |
| 6,200,389 B1 | 3/2001 | Miller et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,234,646 B1 | 5/2001 | Ito | |
| 6,270,572 B1 | 8/2001 | Kim et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,380,627 B1 | 4/2002 | Weihs et al. | |
| 6,416,577 B1 | 7/2002 | Suntoloa et al. | |
| 6,475,276 B1 | 11/2002 | Elers et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,511,539 B1 | 1/2003 | Raaijmakers et al. | |
| 6,534,395 B2 | 3/2003 | Werkhoven | |
| 6,576,053 B1 | 6/2003 | Kim et al. | |
| 6,599,572 B2 | 7/2003 | Saanila et al. | |
| 6,616,982 B2 | 9/2003 | Merrill et al. | |
| 6,652,924 B2 | 11/2003 | Sherman | |
| 6,706,115 B2 | 3/2004 | Leskela et al. | |
| 6,727,169 B1 | 4/2004 | Raaijmakers et al. | |
| 6,794,287 B2 | 9/2004 | Saanila et al. | |
| 6,797,340 B2 | 9/2004 | Fang et al. | |
| 6,800,383 B1 | 10/2004 | Lakhotkin | |
| 6,800,552 B2 | 10/2004 | Elers et al. | |
| 6,809,026 B2 | 10/2004 | Yoon et al. | |
| 6,821,889 B2 | 11/2004 | Elers et al. | |
| 6,827,978 B2 | 12/2004 | Yoon et al. | |
| 6,833,161 B2 | 12/2004 | Wang et al. | |
| 6,863,727 B1 | 3/2005 | Kai-Erik Elers | |
| 6,902,763 B1 | 6/2005 | Elers et al. | |
| 6,986,914 B2 | 1/2006 | Elers et al. | |
| 7,045,406 B2 | 5/2006 | Huotari et al. | |
| 7,138,336 B2 | 11/2006 | Lee et al. | |
| 7,211,144 B2 | 5/2007 | Lu et al. | |
| 7,211,508 B2 * | 5/2007 | Chung et al. | 438/633 |
| 7,268,078 B2 | 9/2007 | Iyer | |
| 7,405,158 B2 * | 7/2008 | Lai et al. | 438/680 |
| 7,416,981 B2 * | 8/2008 | Lee et al. | 438/685 |
| 2001/0041250 A1 | 11/2001 | Werkhoven et al. | |
| 2002/0004293 A1 | 1/2002 | Soininen et al. | |
| 2002/0104481 A1 * | 8/2002 | Chiang et al. | 118/723 I |
| 2002/0182320 A1 | 12/2002 | Leskela et al. | |
| 2003/0049931 A1 | 3/2003 | Byun et al. | |
| 2003/0082296 A1 | 5/2003 | Elers et al. | |
| 2003/0123216 A1 | 7/2003 | Yoon et al. | |
| 2003/0157760 A1 | 8/2003 | Xi et al. | |
| 2003/0194825 A1 | 10/2003 | Law et al. | |
| 2003/0203616 A1 | 10/2003 | Chung et al. | |
| 2004/0130029 A1 | 7/2004 | Raaijmakers et al. | |
| 2004/0206008 A1 | 10/2004 | Sung | |
| 2004/0208994 A1 | 10/2004 | Harkonen et al. | |
| 2004/0224504 A1 | 11/2004 | Gadgil | |
| 2004/0231799 A1 | 11/2004 | Lee et al. | |
| 2005/0037557 A1 | 2/2005 | Doczy et al. | |
| 2005/0106877 A1 | 5/2005 | Elers et al. | |
| 2006/0019494 A1 | 1/2006 | Cao et al. | |
| 2006/0079090 A1 | 4/2006 | Elers et al. | |
| 2006/0165892 A1 | 7/2006 | Weidman | |
| 2006/0211224 A1 | 9/2006 | Matsuda et al. | |
| 2006/0223300 A1 | 10/2006 | Simka et al. | |
| 2006/0240187 A1 | 10/2006 | Weidman | |
| 2006/0251812 A1 | 11/2006 | Kang et al. | |
| 2007/0148350 A1 | 6/2007 | Rahtu et al. | |
| 2008/0102204 A1 | 5/2008 | Elers | |
| 2008/0113110 A1 | 5/2008 | Elers et al. | |
| 2008/0182411 A1 | 7/2008 | Elers | |

FOREIGN PATENT DOCUMENTS

| | | |
|---|---|---|
| EP | 0387403 | 10/1989 |
| EP | 0442490 | 8/1991 |
| EP | 0528779 A1 | 2/1993 |
| EP | 0528779 B1 | 2/1993 |
| EP | 0573033 | 6/1993 |
| EP | 0526779 | 10/1995 |
| EP | 0774533 | 10/1996 |
| EP | 0899779 | 3/1999 |
| EP | 1158070 | 11/2001 |
| EP | 1167567 | 2/2002 |
| JP | 6037041 | 2/1994 |
| JP | 6069157 | 3/1994 |
| JP | 7230957 | 8/1995 |
| JP | 8264530 | 10/1996 |
| JP | 09/087857 | 3/1997 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-14115 | 3/2003 |
| KR | 2003-14117 | 3/2003 |
| KR | 2003-33234 | 5/2003 |
| KR | 2003-40758 | 6/2003 |
| WO | WO 96/18756 | 6/1996 |
| WO | WO 9617107 | 6/1996 |
| WO | WO 9851838 | 11/1998 |
| WO | WO 99/037655 | 7/1999 |
| WO | WO 0001006 | 1/2000 |
| WO | WO 004704 | 8/2000 |
| WO | WO 0047796 | 8/2000 |
| WO | WO 0054320 | 9/2000 |
| WO | WO 00/63957 | 10/2000 |
| WO | WO 01/29891 | 4/2001 |
| WO | WO 0127347 | 4/2001 |
| WO | WO 0129280 | 4/2001 |

| WO | WO 0129893 | 4/2001 |
| WO | WO 0153565 | 7/2001 |
| WO | WO 01/66832 | 9/2001 |
| WO | WO 0178213 | 10/2001 |
| WO | WO 0188972 | 11/2001 |
| WO | WO 2004/077515 | 9/2004 |
| WO | WO 2006/080782 | 8/2006 |

OTHER PUBLICATIONS

U.S. Appl. No. 10/110,730, filed Apr. 11, 2002; Office Actions sent Dec. 22, 2004 and Jan. 14, 2004; Notice of Allowance Jul. 6, 2004.
U.S. Appl. No. 10/100,500, filed Mar. 15, 2002; Office Action sent Mar. 28, 2003; Notice of Allowance Nov. 12, 2003.
Andricacos et al., "Damascene copper electroplating for chip," *IBM Jour. Research and Dev.*, 42:567 (1998).
"Kirk-Othmer Encyclopedia of Chemical Technology," 4th Edition, vol. 4, John Wiley & Sons, Inc. pp. 841-878, (1992).
Bain et al., "Deposition of tungsten by plasma enhanced chemical vapour deposition," *J. Phys. IV France*, vol. 9, pp. 827-833 (1999).
Elers et al., "NbCl5 as a precursor in atomic layer epitaxy," *Applied Surface Science*, 82/83:468-474 (1994).
Girolami, Gregory S., James A. Jensen, John E. Gozum, and Deborah M. Pollina, "Tailored Organometallics as Low-Temperature CVD Precursors to Thin Films," *Materials Research Society Symposium Proceedings*, vol. 121, pp. 429-438, (1988).
Helmut Tulhoff, Hermann C. Starck, and Werk Goslar, "Ullmann's Encyclopedia of Industrial Chemistry," 5th, Completely Revised Edition, vol. A5, pp. 61-77, (1986).
Hermann Jehn, Gudrun Bär, Erich Best, and Ernst Koch, "Gmelin Handbook of Inorganic and Organometallic Chemistry," 8th Edition, vol. A 5b, No. 54, pp. 131-154, (1993).
Hiltunen et al., "Nitrides of titanium, niobium, tantalum and molybdenum grown as thin films by the atomic layer epitaxy method," *Thin Solid Films*, 166:149-154 (1988).
Jeon, H., et al., "A Study on the Characteristics of TiN Thin Film Deposited by Atomic Layer Chemical Vapor Deposition Method," *J. Vac .Sci. Technol. A*, 18(4), 1595-1598 (2000).
Juppo et al., "Deposition of copper films by an alternate supply of CuCl and Zn," *J. Vac. Sci. Technol A*, vol. 15, No. 4, pp. 2330-2333, (Jul./Aug. 1997).
Klaus et al., "Atomic Layer Deposition of Tungsten Nitride Films Using Sequential Surface Reactions," *Journal of the Electrochemical Society*, vol. 147, No. 3, pp. 1175-1181, (2000).
Klaus et al.,"Atomic layer deposition of tungsten using sequential surface chemistry with a sacrificial stripping reaction," *Thin Solid Films*, vol. 360, pp. 145-153, (2000).
Klaus, J.W., et al., "Atomic layer deposition of tungsten and tungsten nitride using sequential surface reactions," *AVS 46th International Symposium*, Seattle, WA, abstract TF-TuM6 (1999).
Klaus, J.W., S.J. Ferro, and S.M. George, "Atomically controlled growth of tungsten and tungsten nitride using sequential surface reactions," *Applied Surface Science*, vols. 162-163, pp. 479-491, (2000).
Lai, Ken K. and H. Henry Lamb, "Precursors for Organometallic Chemical Vapor Deposition of Tungsten Carbide Films," *Chem. Mater.*, vol. 7, pp. 2284-2292, (1995).
Leskelä, et al., "ALD precursor chemistry: Evolution and future challenges," *Jour. Phys. IV France 9*, 837-852 (1999).
Ludviksson et al., "Low-Temperature Thermal CVD of Ti-Al Metal Films Using a Strong Reducing Agent," Chem. Vap. Deposition, vol. 4, No. 4, pp. 129-132, (1998).
Martensson et al., "Atomic Layer Epitaxy of Copper and Tantalum," *Chemical Vapor Deposition*, vol. 3, No. 1, pp. 45-50, (1997).
Martensson et al., "CU(THD)$_2$ As Copper Source in Atomic Layer Epitaxy," *Electrochemical Society Proceedings*, vol. 97-25, pp. 1529-1536.
Martensson, "Use of atomic layer epitaxy for fabrication of Si/TiN/Cu structures," *J. Vac. Sci. Technol. B*, vol. 17, No. 5, pp. 2122-2128, (Sep./Oct. 1999).
Min, Jae-Sik , Young Woong Son, Won-Gu Kang, Soung-Soon Chun, and Sang-Won Kang, "Atomic Layer Deposition of TiN Films by Alternate Supply of Tetrakis (ethylmethylamino)-Titanium and Ammonia," *Jpn. J. Appl. Phys.*, vol. 37, pp. 4999-5004, (1998).
Min,Jae-Sik, Young-Woong Son, Won-Gu Kang, and Sang-Won Kang, "Atomic Layer Deposition of TiN Thin Films by Sequential Introduction of Ti Precursor and HN$_3$," *Mat. Res. Soc. Symp. Proc.*, vol. 514, pp. 337-342, (1998).
Nakajima, Tsuyoshi and Toru Shirasaki, "Chemical Vapor Deposition of Tungsten Carbide, Molybdenum Carbide Nitride, and Molybdenum Nitride Films," *J. Electrochem. Soc.*, vol. 144, No. 6, pp. 2096-2100, (Jun. 1997).
Polyakov et al., "Growth of GaBN Ternary Soloutions by Organometallic Vapor Phase Epitaxy," *Journal of Electronic Materials*, Vo. 26, No. 3, pp. 237-242, (1997).
Ritala et al., "Atomic layer epitaxy growth of TiN thin films," *J. Electrochem. Soc.*, 142(8):2731-2737 (1995).
Ritala et al., "Effects of intermediate zinc pulses on properties of TiN and NbN films deposited by atomic layer epitaxy," *Appl. Surf. Sci.*, 120:199-212 (1997).
Ritala et al., "Perfectly conformal TiN and Al2O3 films deposited by atomic layer deposition," *Chem. Vapor Deposition*, 5:7-9 (1999).
Ritala, Mikko, Markku Leskelä, Eero Rauhala, and Janne Jokinen, "Atomic Layer Epitaxy Growth of TiN Thin Films from TiI$_4$ and NH$_3$," *J. Electrochem. Soc.*, vol. 145, No. 8, pp. 2914-2920, (Aug. 1998).
Ryu et al., "Barriers for copper interconnections," *Solid State Technology*, Apr. 53 (1999).
Sherman et al., "Plasma enhanced atomic layer deposition of Ta for diffusion barrier applications," AVS 46th International Symposium, Paper TF-TuM5 (abstract), (Oct. 26, 1999), Seattle, WA.
Applied Surface Science, vol. 82/83, 1994, Kai-Erik Elers et al., "NbC15 as a precursor in atomic layer epitaxy", p. 468-p. 474, see especially p. 469-471 and 473.
U.S. File History printed Jun. 23, 2009 for U.S. Appl. No. 11/591,845, filed Nov. 1, 2006, entitled "Vapor Deposition of Metal Carbide Films ".
U.S. File History printed Jun. 18, 2009 for U.S. Appl. No. 11/588,837, filed Oct. 27, 2006, entitled "Enhanced Thin Film Deposition".
U.S. File History printed Jun. 18, 2009 for U.S. Appl. No. 11/873,250, filed Oct. 16, 2007, entitled "Plasma-Enhanced Deposition of Metal Carbide Films".
International Search Report and Written Opinion dated Apr. 7, 2008, Application No. PCT/US2007/082131.
International Search Report and Written Opinion dated Jan. 31, 2008, Application No. PCT/US2007/081960.
U.S. Appl. No. 11/591,845, filed Nov. 1, 2006; Office Action mailed Sep. 4, 2008.
U.S. Appl. No. 11/588,837, filed Oct. 27, 2006; Office Action mailed Apr. 2, 2009.
U.S. Appl. No. 11/627,749, filed Jan. 27, 2007; Office Action mailed May 2, 2007 and Nov. 13, 2007.
1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous[ANON], Sep. 19, 2005.
Chang et al., Chemical vapor deposition of tantalum carbide and carbonitride thin film from Me$_3$CE=Ta(CH$_2$CMe$_3$)$_3$ (E= Ch, N), The Royal Society of Chemistry, 2003, pp. 365-369.
Favis et al., Atomic layer epitaxy of silicon, silicon/germanium and silicon carbide via extraction/exchange processes, Avail. NTIS. Report, 1991, pp. 33.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Hara et al., Atomic layer control of .beta.-silicon carbide (001) surface, Springer Proc. Phys., 1992, pp. 90-95.
Jehn et al., Gmelin Handbook of Inorganic and Organometallic Chemistry, 8th Edition, 1993, vol. A 5b, Issue 54, pp. 131-154.

Kim et al., Atomic-layer-depositied WNxCy thin films as diffusion barrier for copper metallization, Applied Physics Letters, Jun. 23, 2003, vol. 82, Issue 25, pp. 4486-4488.

Kirk-Othmer, Encyclopedia of Chemical Technology, John Wiley & Sons, Inc., 1992, vol. 4, pp. 841-878.

Matsunami et al., Hetero-interface control and atomic layer epitaxy of SiC, Applied Surface Science, 1997, vol. 112, pp. 171-175.

Sadayuki et al., Sub-atomic layer growth of SiC at low temperatures, Japanese Journal of Applied Physics, 1995, vol. 34, Issue 11, pp. 6166-6170.

Suntola, Handbook of Crystal Growth 3, Thin Films and Epitaxy, Part B: Growth Mechanisms and Dynamics, Chapter 14, Atomic Layer Epitaxy, pp. 601-663.

Tulhoff et al., Ullmann's Encyclopedia of Industrial Chemistry, $5^{th}$, Completely Revised Edition, 1986, vol. A5, pp. 61-77.

Utriainen et al., Controlled Electrical Conductivity in $SnO_2$ Thin Films by Oxygen or Hydrocarbon Assisted Atomic Layer Epitaxy, J. Electrochem. Soc., 1999, vol. 146, Issue 1, pp. 189-193.

Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.

\* cited by examiner

PERIODIC PLASMA ANNEALING IN AN ALD-TYPE PROCESS

BACKGROUND

1. Field of the Disclosure

The present disclosure relates to deposition of metals and metal nitride thin films. In particular, the disclosure concerns methods of using periodic plasma annealing during an atomic layer deposition process.

2. Description of the Related Art

The integration level of components in integrated circuits is increasing rapidly, which demands a decrease of the size of integrated circuit (IC) components and interconnects. The trend of decreasing feature size is evident, for example, in memory circuits or devices such as dynamic random access memories (DRAMs), flash memory, static random access memories (SRAMs), ferroelectric (FE) memories, and integrated circuit components, such as gate electrodes and diffusion barriers in complementary metal oxide semiconductor (CMOS) devices.

Deposition methods available for forming metal and metal nitride films include atomic layer deposition (ALD), sometimes called atomic layer epitaxy (ALE). ALD processes include, without limitation, thermal ALD processes and plasma enhanced ALD (PEALD) processes, wherein plasma-excited species of a source material are used during certain processing steps. In some cases, an ALD process may include both thermal and PEALD processes.

In a typical thermal ALD process, a substrate is sequentially and alternately contacted with vapor phase pulses of two or more reactants. The reactants are alternately and sequentially pulsed into a reaction space comprising the substrate, which is maintained at an elevated temperature. The substrate temperature is high enough to overcome an energy barrier, such as, for example, the activation energy, during collisions between chemisorbed species on the surface and reactant molecules in the gas phase but low enough to avoid decomposition of the reactants. The pulsing sequence is repeated to form a metal film of desired thickness. Due to the self-limiting nature of ALD, films are grown at rate of about one monolayer (ML) per deposition cycle.

Existing thermal ALD techniques can typically achieve good step-coverage deposition or conformality of metal and metal nitride films, but they can result in high film resistivity and high impurity levels. For example, oxygen and halide impurities can be introduced into ALD films, especially at low deposition temperatures. High oxygen and halide incorporation in metal films can have a negative impact on film resistivity and/or other electrical properties, such as work function.

Existing PEALD techniques can achieve metal and metal nitride film deposition with comparatively good film properties, such as, for example, low resistivity and low impurity levels. However, PEALD typically produces low resistivity and low impurity films at the expense of poorer step coverage relative to thermal ALD. PEALD techniques also typically call for a long period of plasma exposure or plasma-on time during ALD cycles.

SUMMARY

According to one aspect of the invention, atomic layer deposition processes for forming a thin film on a substrate in a reaction space, comprise a) depositing a layer of a first thickness by contacting the substrate with a vapor phase pulse of a metal source chemical; removing excess metal source chemical from the reaction space; contacting the substrate with a vapor phase pulse of one or more plasma-excited reducing species during a first period of time; and removing excess plasma-excited reducing species and reaction by-products from the reaction space; b) repeating step a) for a first number of cycles until the layer of the first thickness is formed; c) contacting the substrate with a vapor phase pulse of one or more plasma-excited reducing species during a second period of time, the second period being not less than about twice as long as the first period; and d) repeating steps a) through c) for a second number of cycles until a film of a second thickness is formed over the substrate.

According to another aspect of the invention, atomic layer deposition processes for forming a thin film on a substrate in a reaction space, comprise a) depositing a layer of a first thickness by contacting the substrate with a vapor phase pulse of a metal source chemical; removing excess metal source chemical from the reaction space; contacting the substrate with a gas phase pulse of one or more reducing species during a first period of time; and removing excess reducing species and reaction by-products from the reaction space; b) repeating step a) for a first number of cycles until the layer of the first thickness is formed; c) contacting the substrate with a vapor phase pulse of one or more plasma-excited reducing species during a second period of time, the second period being not less than twice as long as the first period; and d) repeating steps a) through c) for a second number of cycles until a film of a second thickness is formed over the substrate.

According to another aspect of the invention, atomic layer deposition processes for forming a metal nitride film on a substrate in a reaction space, comprise a) contacting the substrate with a vapor-phase pulse of a metal source chemical; b) contacting the substrate with a vapor phase pulse of one of a reducing agent and a first nitrogen source chemical; c) contacting the substrate with a vapor phase pulse of the other of the reducing agent and the nitrogen source chemical; and d) repeating steps a) through c) for a first number of cycles until a first thickness of between a fraction of an angstrom and one hundred angstroms of material is deposited since either the ALD process began or an annealing step occurred; e) contacting the substrate with a vapor phase pulse of one or more plasma-excited reducing agent and a second nitrogen source chemical for a second period of time; and f) repeating steps a) through e) for a second number of cycles until a metal nitride thin film of a second thickness is formed over the substrate.

According to still another aspect of the invention, structures comprising a semiconductor device comprise a metal film over a substrate, the metal film defining one or more vias having a width of less than about two-tenths of a micrometer, and the metal film comprising no more than about 5 atomic % oxygen.

According to another aspect of the invention, structures comprising a semiconductor device comprise a via having a feature size of less than about two-tenths of a micrometer and a metal nitride film over a substrate, and the metal nitride film comprising no more than about 5 atomic % oxygen.

Some embodiments that are described herein can achieve a level of conformality in metal and/or metal nitride films typical of thermal ALD processes in addition to low resistivity and low impurity levels typical of PEALD processes. Some embodiments improve wafer throughput by employing a relatively short plasma-on time per cycle that does not result in a negative impact on film resistivity and/or other electrical properties. Some embodiments improve the growth rate of metal films during ALD-type processes. Some embodiments reduce the susceptibility to oxidation of metals and metal precursors during ALD-type processes. Some embodiments produce better film densification than existing ALD-type processes. Some embodiments enable selective nitridation of pure metal films through periodic plasma treatment.

All of these embodiments are within the scope of the invention herein disclosed. These and other aspects of embodiments will become readily apparent to those skilled in the art from the following detailed description having reference to the attached figures, the invention not being limited to any particular embodiment(s) disclosed.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

Figure 1:
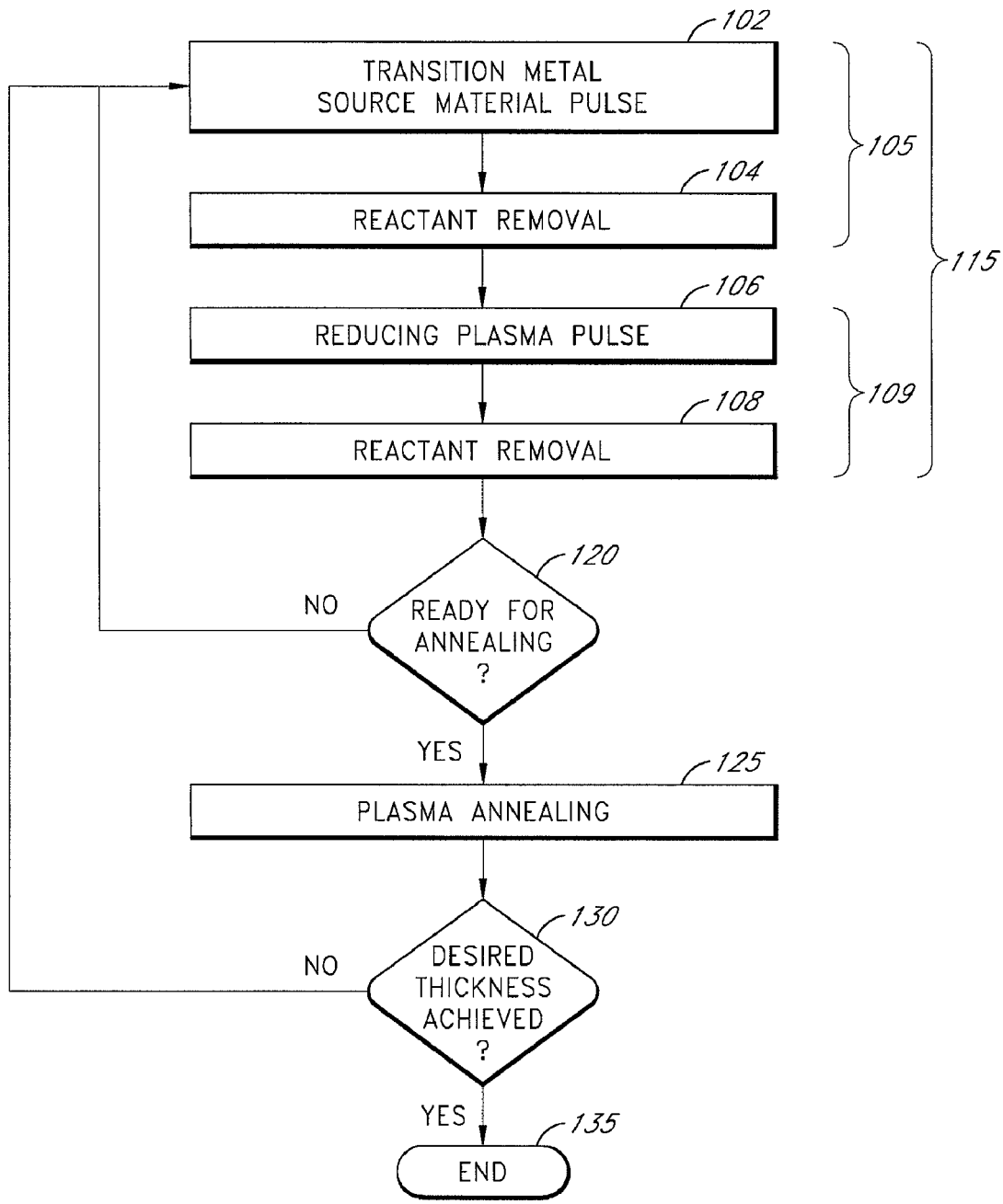
FIG. 1 is a block diagram of a pulsing sequence of an ALD process for depositing a metal film.

The present disclosure describes methods of using plasma annealing during an ALD process. By periodically contacting a substrate in a reaction space with plasma, the extent of undesired oxygen incorporation in metal thin films and metal nitride thin films can be reduced. A nitridizing or reducing plasma allows for shorter latency of reactants in the reactor space, thus reducing unwanted oxygen incorporation because the process is effective at driving off halide impurities that may be present even several tens of angstroms into a film, halide contaminants that may otherwise be associated with reaction latency is reduced. One or more plasma annealing steps can be periodically inserted into an ALD process for creating a metal or a metal nitride thin film.

In context of the present disclosure, an "ALD process" or an "ALD type process" generally includes a process for producing thin films over a substrate molecular layer by molecular layer using self-saturating chemical reactions. General principles of ALD are disclosed, for example, in U.S. Pat. Nos. 4,058,430 and 5,711,811. In an ALD process, gaseous reactants, or, in some contexts, "precursors" or "source chemicals," are introduced into a reaction chamber of an ALD reactor where they contact a substrate located in the chamber to provide a self-limiting surface reaction. The pressure and temperature of the reaction chamber are adjusted to a range where physisorption or condensation of gases and thermal decomposition of the precursors are avoided. Consequently, only up to one monolayer, i.e. an atomic layer or a molecular layer, of material is deposited at a time during each pulsing cycle. The actual growth rate of the thin film, which is typically presented as Å/pulsing cycle, depends, in part, on the number of available reactive surface sites on the substrate and the bulkiness of the reactants. Gas phase reactions between precursors and any undesired reactions with by-products are inhibited by separating precursor pulses from each other in time and by removing excess reactants and by-products, if any, between pulses of reactants. The reaction chamber may be purged with an inactive gas such as nitrogen or argon and/or evacuated using a pump or the like between precursor pulses to remove surplus gaseous reactants and reaction by-products from the chamber.

ALD-type processes include, without limitation, thermal ALD processes and plasma enhanced ALD (PEALD) processes, wherein plasma-excited species of a source chemical or material are used during certain processing steps. In some cases, an ALD-type process can include both thermal and PEALD processes.

"Reaction space" can include a volume in a reactor in which conditions can be adjusted to effect thin film growth by ALD processes.

Using Plasma Annealing in an ALD Process

The methods presented herein enable controlled and conformal deposition of metal and metal nitride thin films on substrate surfaces. The metal or metal nitride may comprise one or more metal species and may comprise small amounts of contaminants as will be recognized by the skilled artisan. Thin films formed according to some embodiments have substantially uniform thicknesses. The thickness of the film depends upon the application and may vary in a wide range, preferably from one atomic layer to 1,000 nanometers (nm) or more. In some embodiments, a thin film is less than about 20 nm in thickness, preferably less than about 10 nm and more preferably less than about 5 nm. In some embodiments, thin films are deposited from halogen-containing metal source chemicals. Geometrically challenging applications are also possible due to the self-limiting nature of surface reactions.

In some embodiments, an atomic layer deposition (ALD) process is used to form metal and/or metal nitride thin films on a substrate, such as an integrated circuit workpiece. A substrate or workpiece placed in a reaction space is subjected to alternating and sequential vapor phase pulses of reactants. In particular, metal and metal nitride thin films are formed by repeating a self-limiting deposition cycle comprising alternate and sequential pulses of metal source chemical and a second reactant such as a nitrogen source chemical. In some embodiments, plasma annealing is performed periodically on the growing metal or metal nitride film. In some embodiments, plasma annealing may be performed after, for example, every four cycles, every twenty cycles, between about 10 and about 50 cycles, between 4 and 100 cycles, or at some other interval but typically not after every cycle. The interval between each annealing process can vary between successive annealing processes.

Metal Film Formation

In one embodiment, the ALD reaction uses multiple deposition reactants to form a metal thin film on a substrate in a reaction space. The reaction space can be, for example, in a single-wafer reactor or a batch reactor, where deposition on multiple substrates takes place at the same time. A first reactant or source chemical comprising a metal species is introduced to the reaction space and will form no more than about one atomic monolayer by adsorbing on the substrate surface. Adsorption may include forming a chemical bond to the surface, or chemisorption or forming a weakly-bound condensed phase on the surface, or physisorption. In some embodiments, the metal species is a transition metal desired in the layer being deposited. The film to be formed may be a transition metal or a plurality of transition metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and combinations thereof. The metal source chemical, also referred to herein as the "metal reactant," maybe a halide. For some embodiments, the metal source material is selected from the group consisting of metal bromides, metal chlorides, metal fluorides and metal iodides. In some embodiments, the metal source chemical is a tantalum compound selected from the group consisting $TaBr_w$, $TaCl_x$, $TaF_y$ and $TaI_z$, where 'w', 'x', 'y' and 'z' are integers from 1 to 6.

In some embodiments, the second reactant is a reducing agent. The second reactant may comprise plasma-excited species and may be, for example, a hydrogen plasma and thus include plasma-excited species of hydrogen, such as hydrogen radicals (H*) and/or hydrogen ions ($H^+$, $H_2^+$). Plasma-excited species of hydrogen may be generated by a plasma generator either in the reaction space or remotely. As an example, plasma-excited species of hydrogen may be generated in the reaction space using a showerhead-type PEALD reactor disclosed in U.S. Patent Application No. 2004/0231799. As another example, the hydrogen plasma may be generated externally with respect to the reaction space, such as in a remote plasma generator. In alternative embodiments, the second reactant is a gas-phase reducing agent, such as, for example, $NH_3$. One or more of the reactants may be provided with the aid of an inert carrier gas.

One phase of the ALD cycle can be called the "metal phase" or the "first phase" of the cycle. In the metal phase, the first reactant, which can comprise a metal species, is supplied to the reaction chamber and chemisorbs on the substrate surface. The reactant is supplied at a temperature that avoids decomposition and condensation of the reactant.

The reactant supplied in the metal phase is selected such that the amount of reactant that can be bound to the surface is limited by the number of available binding sites and by the physical size of the chemisorbed species including ligands. The chemisorbed layer left by a pulse of the metal reactant is self-terminated with a surface that is non-reactive with the remaining chemistry of that pulse. As a result, once all available binding sites are occupied, no additional reactant is absorbed. This phenomenon is referred to herein as "self-saturation." In some embodiments, more than one metal source gas can be supplied simultaneously such that the layer comprises more than one metal species. In other embodiments, a single reactant comprising two or more different metal species may be supplied.

Maximum step coverage on the workpiece surface is obtained when no more than about a single molecular layer of metal source material molecules is chemisorbed in each self-limiting pulse. Due to the size of the chemisorbed species and the number of reactive sites, somewhat less than a monolayer (ML) is typically deposited in each pulse of metal reactant.

Excess first reactant and reaction by-products, if any, are removed from the reaction space with the aid of a purge gas and/or by evacuation. Purge gas can be, for example and without limitation, argon (Ar), helium (He) and hydrogen ($H_2$).

Another phase of the ALD cycle can be called the "second phase" or the "reduction phase." In the reduction phase of the ALD cycle, a second reactant, which may be a reducing agent, is provided in the reaction space. In some embodiments, the second reactant is capable of donating electrons to the transition metal or plurality of transition metals defining the deposited metal film, thereby decreasing the oxidation state of the transition metal. In some embodiments, the second reactant is a hydrogen plasma, which includes plasma-excited species of hydrogen. In some embodiments, the first reactant is a transition metal halide and the plasma-excited species of hydrogen remove halide atoms or residues from a metal film adsorbed in the first phase, thus donating electrons to the film and forming a reduced metal film. As an example, if a tantalum-containing film is formed in the first phase, exposure of the film to plasma-excited species of hydrogen may reduce the tantalum film from an oxidation state of +5 to 0. The second reactant is introduced into the reaction chamber as a gas-phase reducing agent.

In a "third phase" of the cycle, also referred to herein as an "annealing phase," the metal film formed in the first three phases is annealed by exposing the film to a third reactant, which may include a reducing gas. The delivery of the gas to the reaction space may be assisted with an optional inert gas. The activated annealing species reacts with the surface of the film, thereby annealing at least one monolayer, and up to several tens of angstroms of a layer. Highly reactive metal films getter trace amounts of oxygen in a reactor. The annealing species drives off halide impurity and/or unwanted oxygen by penetrating a layer up to several tens of angstroms thick. Driving off halide impurities can improve the electrical characteristics of the metal film. Furthermore, the use of an annealing phase in an ALD process can reduce the average cycle time. Reduction of the cycle time limits oxidation during formation of the metal film, for example as a result of atmospheric permeation into the reaction space.

In some embodiments, the metal phase and reducing phase are repeated until a desired or predetermined thickness of a layer is achieved. The interval for the repetition of the first phase and second phase can be chosen based on the number of ALD or PEALD cycles required to provide a layer having a thickness approximately equal to or just less than the penetration depth of the plasma annealing employed. An activated reactant can penetrate several tens of angstroms into a film during plasma annealing, depending on the nature of the film and plasma conditions. For example, in some embodiments, the first and second phases are repeated more than three times between annealing phases. In other embodiments, the first and second phases are repeated between ten and sixty times, more than twenty times, or about fifty times between annealing phases.

Provision of a particular reactant is generally considered to follow provision of another reactant if a purge or other reactant removal step intervenes.

FIG. 1 shows one example embodiment of an ALD process for depositing a metal film. The process can begin with optional initial surface termination (not shown).

After initial surface termination, if necessary, a transition metal source is provided to the reaction space as indicated by reference number 102. The first reactant or source material is supplied to the substrate or workpiece surfaces. In the embodiment shown in FIG. 1, the first reactant pulse comprises a volatile halide that is reactive with the workpiece surfaces of interest. The halide comprises a metal species that is to form part of the deposited layer and is preferably pulsed into the reaction space with the aid of a carrier gas. The halogen-containing species adsorbs upon the workpiece surfaces in a self-limiting manner. In some embodiments, the first reactant is a transition metal source material, such as a metal halide, and the thin film being formed comprises a metal. The first reactant pulse self-saturates the workpiece surfaces such that any excess constituents of the first reactant pulse do not further react with the monolayer formed by this process. Self-saturation is due, at least in part, to halide tails terminating the monolayer, protecting the layer from further reaction.

The excess first reactant is then removed from the reaction space as indicated by number 104. Excess transition metal halide and reaction by-products may be purged from the reaction space by stopping the flow of the first reactant while continuing to flow a carrier gas, preferably an inert gas, e.g., Ar or $H_2$, for a sufficient time. Excess reactants and reaction by-products may also be removed by evacuating the reaction space, for example with the aid of a vacuum pump, or by a combination of purging and evacuating. The removal 104 may comprise continuing to flow purge gas for between about 0.1 seconds and 20 seconds after stopping the flow of the first reactant pulse. Inter-pulse purging is described in U.S. Pat. No. 6,511,539, entitled, "APPARATUS AND METHOD FOR GROWTH OF A THIN FILM,". In other embodiments, the reaction space can be pumped down between alternating chemistries. See, for example, PCT publication number WO 96/17107, published Jun. 6, 1996, entitled, "METHOD AND APPARATUS FOR GROWING THIN FILMS." Together, the adsorption 102 and reactant removal 104 represent a first phase 105 in an ALD cycle. The first phase in the illustrated ALD cycle is thus the metal phase.

With continued reference to FIG. 1, a second reactant is provided to the reaction space as indicated by number 106. The second reactant may be contacted with the workpiece in order to reduce the monolayer left by the first reactant and the second reactant is a reducing agent. In one embodiment, the second reactant includes plasma-excited species of hydrogen and generating the second reactant pulse comprises generating plasma-excited species of hydrogen in the reactor or remotely. The plasma-excited species of hydrogen can reduce the oxidation state of the metal, or plurality of metals, in the film formed in the first phase. In some embodiments, generating plasma-excited species of hydrogen includes introducing hydrogen gas into the reaction space and generating hydrogen plasma in situ. Generating plasma-excited species can include providing power to an RF electrode to generate the plasma. In other embodiments, plasma-excited species of hydrogen are generated in a separate reactor in communication with the reaction space and subsequently directed to the reaction space. Plasma parameters that are suitable to reduce the oxidation state of the deposited metal layer are selected. Plasma parameters can include, for example, a plasma power setting, a reaction space pressure, a reactant flow, and/or a reactant flow rate.

In other embodiments, gas-phase reducing agents other than plasma-excited species of hydrogen can be used to reduce the monolayer left by the first reactant.

After a time period sufficient to reduce the monolayer, provision of the second reactant is stopped, for example, by terminating plasma generation, and reaction by-products, if any, are removed from the reaction space, preferably with the aid of a purge gas as indicated by number 108 in FIG. 1. In some embodiments, removing reactants includes purging and/or evacuating excess reducing agent and reaction by-products from the reaction space. The removal can be as described with respect to reference number 104. Together, steps 106 and 108 represent a reduction phase 109 of the illustrated process.

The first phase 105 and second phase 109 may be repeated as desired until a metal film layer has been formed that is ready for annealing. For example, the metal film layer may be ready for annealing when the thickness of the current film layer is approximately equal to or just less than the penetration depth of the annealing process as indicated by number 120. As another example, the metal film layer may be ready for annealing when the thickness of the film layer is approximately equal to or greater than a predetermined thickness, such as about ten angstroms, about fifteen angstroms, about twenty angstroms, or some other thickness. The first 105 and second phases 109 may also be repeated a predetermined number of times, such as, for example, more than three times, about twenty times, between five and fifty times, etc. Together, the first phase and second phase represent a metal layer phase 115. The metal layer phase 115 produces a metal thin film layer over the substrate, which may comprise a previously deposited layer.

Next, the metal thin film is annealed by exposing it to a third reactant for a time period sufficient to anneal the metal film layer produced during phase 115, as indicated by number 125 in FIG. 1. In some embodiments, the third reactant is a plasma-activated reducing agent. For example, exposing the metal thin film to a third reactant can include providing plasma-excited reducing gases to the reaction space for a period of time to anneal the metal film layer. The period of time for annealing is generally longer than the duration of the reducing phase 106 and typically at least twice as long. The exposure time may be more than one second, several seconds, about twenty seconds, or between about one second and sixty seconds, for example. As another example, the exposure time can be more than about twice as long as the duration of the reducing phase 106.

During the annealing phase 125, a plasma-activated vapor phase of the third reactant anneals the film layer, thereby driving oxygen and/or halide impurities from the metal film. For example, the level of oxygen in the film may be reduced to no more than about 5 atomic %. Argon or another suitable carrier gas may also be supplied to the reaction chamber during this phase. The third reactant can be supplied under plasma parameters suitable to anneal the deposited metal layer. Plasma parameters can include, for example, a plasma power setting, a reaction space pressure, a reactant flow, and/or a reactant flow rate. In some embodiments, one or more plasma parameters selected during the annealing phase 125 differ from those used during the second reactant pulse 106.

The process of depositing and annealing a metal film layer is repeated until a metal thin film of the desired thickness is achieved as indicated by number 130 in FIG. 1. The process may be repeated for example, two or more times, four or more times, between two and fifty times, etc. After the desired thickness of the film is reached and/or the process is repeated a predetermined number of times, the process ends as indicated by number 135.

In some embodiments, providing plasma-excited reducing gases to anneal the metal film layer reduces the time during which phase 115 would be performed in the absence of the anneal to generate a film of the desired quality. For example, in some embodiments, the average cycle time may be less than half the average cycle time of an ALD process that does not include plasma annealing. Specifically, in some embodiments, the time required to perform purging and/or evacuating of excess transition metal halide and reaction by-products from the reaction space may be reduced from several seconds to about a second, less than a second, or even a fraction of a second when plasma annealing is used. In one embodiment in which a 20-second annealing step was performed after every 50 metal/reduction cycles, for example, the metal source reactant purge time was reduced from 3.00 seconds to 0.65 seconds per cycle. Moreover, the plasma ALD pulse time was reduced from 2.00 seconds to 1.60 seconds per cycle. As a result, the average cycle time was reduced from 8.05 seconds to 3.75 seconds. Thus, the time to deposit a metal layer was approximately halved.

During existing PEALD processes, halide impurity can typically be lowered and electrical properties improved from longer plasma-on time after each precursor adsorption step. However, oxidation of metal layers increases as cycle time increases. The benefit of halide impurity reductions achieved by longer plasma-on time is counterbalanced by the drawbacks of decreased wafer throughput and increased metal layer oxidation the result from increased cycle time. In some embodiments, oxidation of metal layers can be reduced because less average cycle time is used to grow such layers. Furthermore, the incidence of unwanted halide impurities can be mitigated as the impurities are driven off during annealing.

Semiconductor integration considerations can limit the temperature at which metal films can be deposited by thermal ALD. Poorer film resistivity and higher impurity concentrations typically accompany lower deposition temperatures. Application of periodic plasma annealing can improve the resistivity and impurity levels of metal films deposited at low temperatures. As an example, some manufacturers require that $TiCl_4$-based ALD TiN be deposited at a temperature not exceeding 275° C., whereas the optimal temperature for film quality is closer to 400° C. Acquiring an un-annealed $TiCl_4$-based ALD TiN film deposited at 275° C. with a resistivity below about 600 μΩ-cm can be difficult. Periodic plasma annealing may reduce the resistivity of a metal film, for example, to a value from about 90% to about 50% of the original resistivity.

Metal Nitride Film Formation

In some embodiments, the ALD reaction uses multiple deposition reactants to form a metal nitride thin film on a substrate in a reaction space. The deposition reactants include a source chemical and a reducing agent, such as the reactants described above with respect to the formation of metal thin films. Metal nitride thin film deposition typically employs a nitridizing reactant in addition to the aforementioned reactants.

In some embodiments, the nitridizing reactant is a nitrogen source material or chemical. The nitrogen source material is typically not a halide, although in some embodiments it may be. In some embodiments, the nitrogen source material is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride ($NF_3$), hydroxylamine ($NH_2OH$) and salts thereof, tert-butylamine ($NH_2C(CH_3)_3$) and salts thereof, allylamine ($NH_2CH_2CHCH_2$) and salts thereof, ter-tbutylamidi, ammonium fluoride, ammonium chloride, $CH_3N_3$, hydrazine hydrochloride dimethyl hydrazine, hydroxylamine hydrochloride, methylamine, diethylamine, triethylamine and combinations thereof. In some embodiments, the nitrogen source material comprises ammonia ($NH_3$). In other embodiments, the nitrogen source material comprises plasma-excited species of a nitrogen-containing chemical generated in the reaction space or remotely. In some embodiments, the nitrogen source material includes plasma-excited species of ammonia ($NH_3$). In other embodiments, the nitrogen source material includes plasma-excited species of nitrogen ($N_2$) and hydrogen ($H_2$).

In metal nitride film deposition, a nitrogen-contributing step is added to the phases of the metal film deposition process described previously. In the nitrogen-contributing step, a nitrogen source chemical, also known as a "nitridizing agent" or "nitridizing reactant," is introduced into the reaction space at one or more points during the deposition. The nitrogen source chemical reacts with the reduced metal film previously deposited on the substrate surface in the preceding phase to form a metal nitride film. The nitrogen source chemical may be provided at the same time as the reducing agent, may be provided after the reducing agent, or may reduce and contribute nitrogen. In some embodiments, the nitrogen source chemical is provided in a different step before or after the reducing agent is introduced into the reaction chamber.

In some embodiments, two reactants, such as a source chemical and a reducing agent including nitrogen, are used to form a metal nitride film. For example, a first reactant including a metal source chemical can be provided to the reaction space during a metal phase. After removal of the first reactant, a reducing agent including nitrogen, such as $NH_3$, is provided to the reaction space during a reducing and nitridizing phase.

In other embodiments, a third reactant is used as a nitridizing agent. For example, a first reactant including a metal source chemical can be provided to the reaction space during a metal phase. After removal of the first reactant, a reducing agent that does not include nitrogen, such as $H_2$, is provided to the reaction space during a reducing phase. A separate nitridizing agent, such as $N_2$, can also be provided to the reaction space in combination with the reducing agent. The nitridizing agent may also be provided to the reaction space immediately before or after the reducing agent is introduced.

In some embodiments, exposure of the film to the nitridizing reactant occurs during a plasma annealing phase. For example, a first reactant including a metal source chemical can be provided to the reaction space during a metal phase. After removal of the first reactant, a reducing agent that does not include nitrogen, such as $H_2$, is provided to the reaction space during a reducing phase. After removal of the second reactant and repeated exposure to the first and second reactants, the film may be exposed to several seconds of a plasma anneal during an annealing phase. The plasma anneal can occur in the presence of nitridizing and/or reducing gases, thus providing a nitrogen source chemical to the metal nitride film. One or more of the reactants may be provided with the aid of an inert carrier gas.

In some embodiments, the metal phase, reducing phase, and/or nitridizing step are repeated until a desired thickness of a layer is achieved. In some embodiments, the metal phase, reducing phase, and/or nitridizing step are repeated until a predetermined thickness of a layer is achieved. The interval for the repetition of the first phase and second phase can be chosen based on the number of ALD or PEALD cycles required to provide a layer having a thickness approximately equal to or just less than the penetration depth of the plasma annealing process/step employed. Some nitridizing or reducing plasmas can penetrate several tens of angstroms into a film during plasma annealing, depending on the nature of the film and plasma conditions. For example, in some embodiments, the first and second phases are repeated more than three times between annealing phases. In other embodiments, the first and second phases are repeated between ten and sixty times, more than twenty times, or about fifty times between annealing phases. The entire process can be repeated more than five times, for example, until a layer of desired thickness is achieved.

In a "third phase" of the cycle, also referred to herein as an "annealing phase," the metal nitride film formed in the first three phases is annealed by exposing the film to a third reactant, which is preferably a nitridizing and/or reducing gas. The activated annealing species reacts with the surface of the film, thereby annealing at least one monolayer, and up to several tens of angstroms of a layer. Highly reactive metal or metal-nitride films getter trace amounts of oxygen in a reactor. The annealing species drives off oxygen and halide impurity by penetrating a layer up to several tens of angstroms thick. Driving off halide and oxygen impurities can improve the electrical characteristics of the metal or metal-nitride film.

Provision of a particular reactant is generally considered to follow provision of another reactant if a purge or other reactant removal step intervenes.

Figure 2:
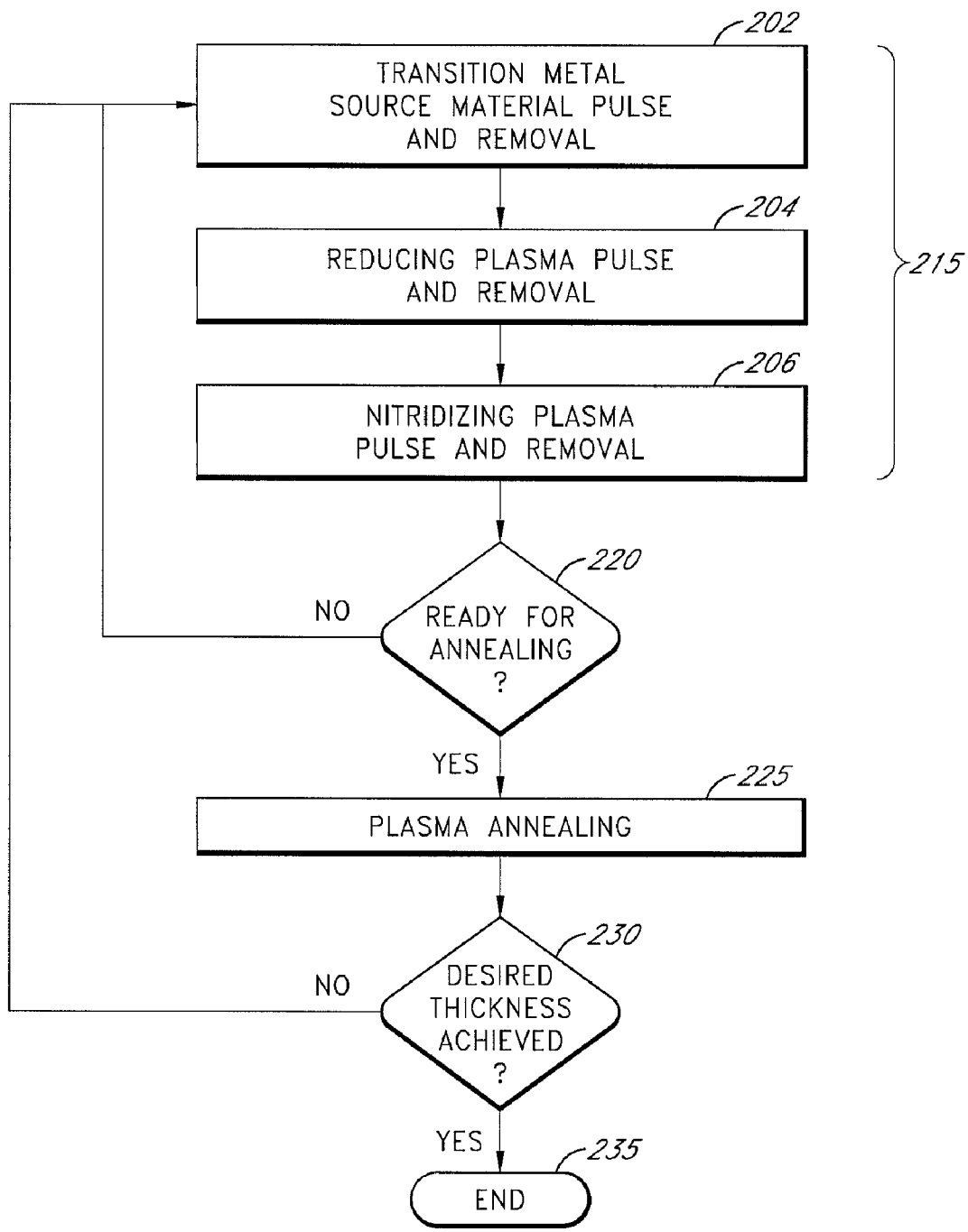
FIG. 2 is a block diagram of a pulsing sequence of an ALD process for depositing a metal nitride film.

FIG. 2 shows one example embodiment of an ALD process for depositing a metal nitride film. The process can begin with optional initial surface termination (not shown).

With reference to FIG. 2, after initial surface termination, if necessary, a first reactant or source material is supplied to the substrate as indicated by number 120. In accordance with some embodiments, the first reactant pulse comprises a volatile halide that is reactive with the workpiece surfaces of interest. The halide comprises a metal species that is to form part of the deposited layer and is preferably pulsed into the reaction space with the aid of a carrier gas. The halogen-containing species adsorbs upon the workpiece surfaces in a self-limiting manner. The first reactant may be a transition metal source material, such as a metal halide, and the thin film being formed may comprise a metal nitride. The first reactant pulse self-saturates the workpiece surfaces such that any excess constituents of the first reactant pulse do not further react with the monolayer formed by this process. Self-saturation is due, at least in part, to halide tails terminating the monolayer, protecting the layer from further reaction. The first reactant is then removed from the reaction space as described with respect to the metal layer deposition process.

With continued reference to FIG. 2, a second reactant is illustrated in FIG. 1 contacted with the workpiece, as indicated by number 204. The second reactant preferably reduces the monolayer left by the first reactant. In one embodiment, the second reactant includes one or more plasma-excited reducing species, such as plasma activated hydrogen gas or hydrogen radicals. In some embodiments, the second reactant pulse comprises generating plasma-excited reducing species in the reactor or remotely. For example, the plasma-excited species of hydrogen can reduce the oxidation state of the metal or plurality of metals in the film formed in the first phase. In some embodiments, a gas-phase reducing agent can be used to reduce the monolayer left by the first reactant.

In some embodiments, providing plasma-excited reducing species includes introducing hydrogen gas into the reaction space and generating hydrogen plasma in situ. This step may include providing power to an RF electrode to generate the plasma. After a desired exposure time, plasma production is terminated and reaction by-products, if any, are removed using purging and/or evacuation. In other embodiments, plasma-excited species of hydrogen are generated remotely, such as, for example, in a separate reactor in communication with the reaction space and subsequently directed to the reaction space. After the desired exposure time, plasma flow to the reactor is stopped and excess reactant and reaction by-products are removed from the reaction space.

During a nitridizing step 206, a nitrogen-contributing reactant or source material pulse can be supplied to the workpiece. In the embodiment shown in FIG. 2, the nitrogen-contributing reactant is a nitrogen source chemical that reacts with the surface left by the first and second reactants. In one embodiment, the nitrogen source chemical is supplied to the workpiece with the aid of a carrier gas. Preferably, the nitrogen-contributing reactant pulse leaves no more than about a monolayer of a metal nitride film. The nitrogen-contributing reactant pulse can also be self-saturating. In some embodiments, the nitridizing step 206 can occur during the reducing phase 204. In alternative embodiments, the nitridizing step 206 and occur before and/or after the reducing phase 204.

After a time period sufficient to reduce the monolayer, to reduce the nitride layer of multiple cycles prior to reduction and/or to completely saturate and react the monolayer with the nitrogen-contributing reactant, plasma generation is terminated, and reaction by-products, if any, are removed from the reaction space, preferably with the aid of a purge gas. The removal can occur as described in the discussion of reference number 104 (FIG. 1).

The metal phase 202, the reducing phase 204, and the nitridation step 206 may be repeated as desired until a metal nitride film layer is ready for annealing, as indicated by number 220. For example, the metal nitride layer may be ready for annealing when the thickness of the current film layer is approximately equal to the penetration depth of the annealing process. The metal phase 202, the reducing phase 204, and the nitridation step 206 may also be repeated a predetermined number of times, such as, for example, more than three times, about twenty times, about fifty times, between five and one hundred times, or some other number of times. Together, metal phase 202, the reducing phase 204, and the nitridation step 206 represent a metal nitride layer phase 215. The metal nitride phase 215 produces a metal nitride layer over the substrate or over a previously deposited metal nitride layer.

In some metal nitride film formation embodiments, the metal phase 202 and the reducing phase 204 can be repeated several times before a nitrogen source chemical is provided to the reaction space during a nitridation step 206, thus forming a reduced metal film with thickness greater than one monolayer. The skilled artisan will recognize, however, that the thickness of the metal film will be chosen such that exposure of the film to a nitrogen source material will produce a metal nitride layer with compositional uniformity throughout the film. In some embodiments, the metal phase 202 and the reducing phase 204 can be repeated as desired so long as the thickness of the deposited film is less than or equal to about 30 Å, less than or equal to about 20 Å, or less than or equal to some other thickness.

Next, as indicated by number 225, the metal nitride thin film is exposed to a third reactant, which is preferably an ionized nitridizing and/or reducing gas. The exposure continues for a time period sufficient to anneal the metal nitride film layer produced during phase 215. The exposure time may be more than one second, several seconds, about twenty seconds, or between one second and sixty seconds, for example. During the annealing phase 225, a plasma anneals the film layer, thereby driving oxygen and/or halide impurities from the metal nitride film. Argon may also be supplied to the reaction chamber during this phase. The annealing phase 225 may also allow selective or custom nitridization of the metal nitride film because the nitrogen-contributing reactant may be supplied at various intervals during the ALD process.

In some embodiments, providing plasma-excited nitridizing and/or reducing gases to anneal the metal nitride film layer reduces the time during which the metal nitride phase 215 is performed. For example, in some embodiments, the average cycle time for the process shown in FIG. 2 may be less than half the average cycle time of an ALD process that does not include plasma annealing. Specifically, in some embodiments, the time required for purging and/or evacuating excess transition metal halide and reaction by-products from the reaction space during the metal phase 202 may be reduced from several seconds to about a second, less than a second, or even a fraction of a second when plasma annealing is used.

The process of depositing and annealing a metal nitride film layer repeats until a desired thickness of the metal nitride thin film is achieved, as indicated by number 230. The process may also repeat a predetermined number of times, such as, for example, twenty times, forty times, between ten and forty times, between four and one hundred times, more than three times, or some other number of times. After the desired thickness of the film is reached and/or the process is repeated a number of times, the process ends, as indicated by number 235.

While the phases of ALD processes described herein are sometimes referred to as a "first phase" or as a "second phase," these designations do not necessarily specify the order in which the phases are performed. For example, the order in which the metal phase, the reducing phase, and the nitridizing step (if applicable) are performed, and the number of times each phase or combination of phases is performed, may be selected as desired.

Example 1

In a first example, a film including titanium is deposited in a PEALD process. The process uses a PEALD reaction chamber power of 500 W at a pressure of 2 Torr. The process includes the following steps:

1. providing a pulse of $TiCl_4$ to the reaction space;
2. purging excess $TiCl_4$ and reaction by-products from the reaction space with Ar for 0.65 seconds;
3. providing plasma-excited $H_2$ to the reaction space with Ar as an inert carrier gas for 1.6 seconds;
4. purging excess plasma-excited $H_2$ and reaction by-products from the reaction space with Ar;
5. repeating steps 1 through 4 fifty times;
6. providing plasma-excited $H_2$ to the reaction space with Ar as an inert carrier gas for 20 seconds; and
7. repeating steps 1-6 fourteen times.

Example 2

In a second example, a film including titanium nitride is deposited in a PEALD process. The process uses a PEALD reaction chamber power of 500 W at a pressure of 2 Torr. The process includes the following steps:

1. providing a pulse of $TiCl_4$ to the reaction space;
2. purging excess $TiCl_4$ and reaction by-products from the reaction space with Ar for 0.65 seconds;
3. providing plasma-excited $H_2$ and plasma-excited $N_2$ to the reaction space with Ar as an inert carrier gas for 1.6 seconds;
4. purging and/or evacuating excess plasma-excited $H_2$, $N_2$, and reaction by-products from the reaction space with Ar;
5. repeating steps 1 through 4 fifty times;
6. providing plasma-excited $H_2$ and plasma-excited $N_2$ to the reaction space with Ar as an inert carrier gas for 20 seconds; and
7. repeating steps 1-6 fourteen times.

The example process described produced a titanium nitride film with a thickness of 191 angstroms in 46 minutes. The growth rate of the layer was 0.27 angstroms per cycle. The layer had a thickness uniformity of 4.3% and a resistivity of 115.0 $\mu\Omega$-cm.

Example 3

In a third example, a film including titanium nitride is deposited in an ALD process. The process uses a reaction chamber at a pressure of 2 Torr. The process includes the following steps:

1. providing a pulse of $TiCl_4$ to the reaction space;
2. purging excess $TiCl_4$ and reaction by-products from the reaction space with Ar;
3. providing $NH_3$ to the reaction space;
4. purging excess $NH_3$ and reaction by-products from the reaction space with Ar;
5. repeating steps 1 through 4 fifty times;
6. providing plasma-excited $H_2$ and plasma-excited $N_2$ to the reaction space with Ar as an inert carrier gas for 20 seconds; and
7. repeating steps 1-6 fourteen times.

Example 4

In a fourth example, a film including tantalum nitride is deposited in a PEALD process. The process uses a PEALD reaction chamber power of 500 W at a pressure of 2 Torr. The process includes the following steps:

1. providing a pulse of Ta-halide to the reaction space;
2. purging excess Ta-halide and reaction by-products from the reaction space with Ar for 0.65 seconds;
3. providing plasma-excited $H_2$ to the reaction space with Ar as an inert carrier gas for 1.6 seconds;
4. purging excess plasma-excited $H_2$ and reaction by-products from the reaction space with Ar;
5. repeating steps 1 through 4 fifty times;
6. providing plasma-excited $H_2$ and plasma-excited $N_2$ to the reaction space with Ar as an inert carrier gas for 20 seconds; and
7. repeating steps 1-6 fourteen times.

Metal and Metal Nitride Films in a Semiconductor Device

Figure 3:
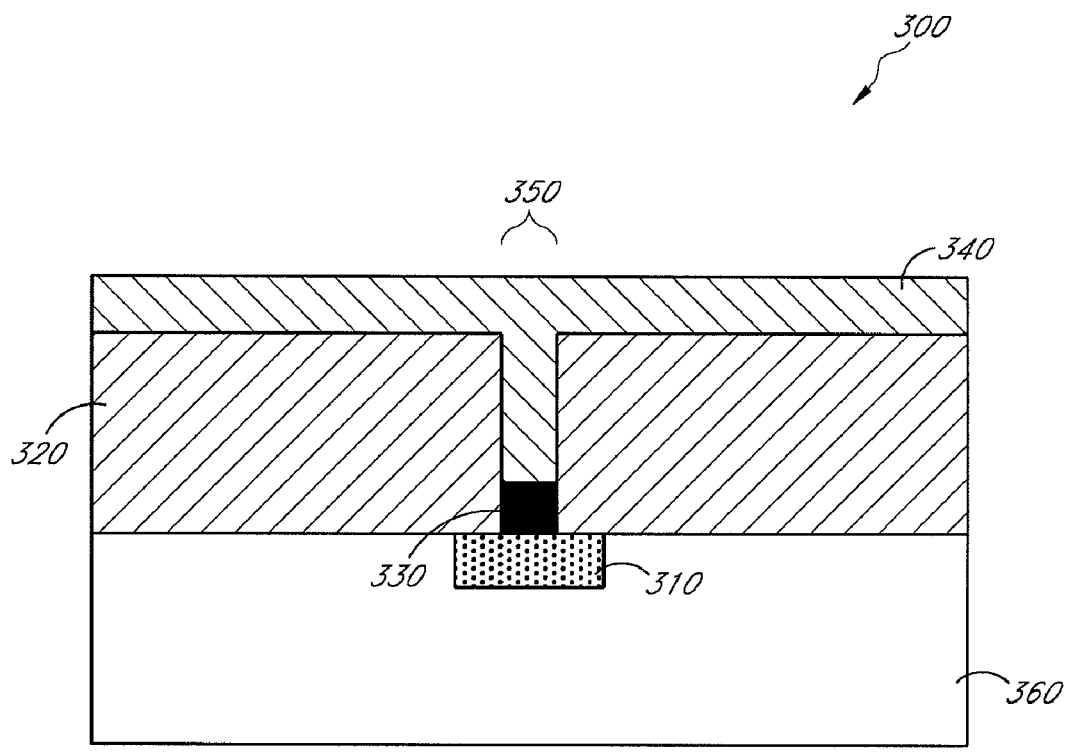
FIG. 3 is a schematic, cross-sectional side view of a semiconductor device comprising a metal film formed using the methods disclosed herein.

With reference to FIG. 3, a semiconductor device 300 containing a metal layer 340 formed according to methods of an embodiment comprises a substrate 360 having an optional doped region 310. A gate stack 330 is situated within a via 350 that is formed within a dielectric layer 320. The metal layer 340 is deposed over the gate stack 330 and the dielectric layer 320. The substrate 360 may comprise material selected from the group consisting of silicon, silica, coated silicon, copper metal, dielectric materials and combinations thereof. The layers shown in FIG. 3 are not necessarily drawn to scale. The metal layer 340 is formed using an ALD process into sites on the exposed top surface of the gate stack 330 and dielectric layer 320. The metal layer 340 can have a thickness of several monolayers. Plasma annealing performed during deposition can reduce the incidence of oxygen and halide impurities within metal layer 340 and/or a metal nitride layer within gate stack 330. For example, a metal layer 340, or a metal nitride layer within gate stack 330, deposited according to one or more of the methods described herein, may comprise no more than about 5 atomic % oxygen. In some embodiments, the metal layer 340 comprise at most about 3 atomic % oxygen.

The films formed according to methods described above may define, for example, diffusion barriers in damascene or dual damascene structures in integrated circuits, metal gates in transistors, or metal electrodes in capacitor structures. In some embodiments, metal and/or metal nitride films may serve as top/bottom electrodes for MIM/MIS capacitor, such as eDRAM, DRAM, RF decoupling, planar and 3-D capacitors.

In at least some of the aforesaid embodiments, any element used in some embodiments can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. An atomic layer deposition process for forming a thin film on a substrate in a reaction space, comprising in sequence:
   a) depositing a layer of a first thickness by:
      contacting the substrate with a vapor phase pulse of a metal source chemical;
      removing excess metal source chemical from the reaction space;
      contacting the substrate with a vapor phase pulse of one or more plasma-excited reducing species during a first period of time; and
      removing excess plasma-excited reducing species and reaction by-products from the reaction space;
   b) repeating step a) for a first number of cycles until the layer of the first thickness is formed;
   c) contacting the substrate with a second vapor phase pulse of one or more plasma-excited reducing species during a second period of time, the total second period being not less than about twice as long as the total first period of time that the substrate is contacted with a plasma-excited reducing species in step a); and
   d) repeating steps a) through c) for a second number of cycles until a film of a second thickness is formed over the substrate.

2. The process of claim 1, further comprising:
   introducing one or more reducing species at a first reactant flow rate into the reaction space during the first period of time;
   setting the pressure of the reaction space to a first pressure during the first period of time; and
   setting a plasma power control of the reaction space to a first power during the first period of time.

3. The process of claim 2, further comprising:
   introducing one or more reducing species at a second reactant flow rate into the reaction space during the second period of time;
   setting the pressure of the reaction space to a second pressure during the second period of time; and
   setting the plasma power control of the reaction space to a second power during the second period of time;
   wherein at least one of the first reactant flow rate, the first pressure, or the first power differs from at least one of the second reactant flow rate, the second pressure, or the second power, respectively.

4. The process of claim 1, wherein depositing a layer of a first thickness further comprises contacting the substrate with a vapor-phase pulse of one or more plasma-excited nitrogen source chemicals.

5. The process of claim 4, wherein contacting the substrate with a vapor-phase pulse of one or more plasma-excited nitrogen source chemicals occurs substantially during the first period of time.

6. The process of claim 4, wherein contacting the substrate with a vapor-phase pulse of one or more plasma-excited nitrogen source chemicals occurs during a period of time other than the first period of time.

7. The process of claim 1, wherein contacting the substrate with a second vapor phase pulse of one or more plasma-excited reducing species comprises contacting the substrate with a vapor phase pulse of one or more plasma-excited species of hydrogen.

8. The process of claim 1, further comprising contacting the substrate with a vapor-phase pulse of one or more plasma-excited nitrogen source chemicals during the second period of time.

9. The process of claim 1, wherein the second thickness is not less than about twenty angstroms.

10. The process of claim 1, wherein the first thickness is not more than about ten angstroms.

11. The process of claim 1, wherein the first thickness is between one-tenth of an angstrom and one angstrom.

12. The process of claim 1, wherein at least one of the first number of cycles, the second number of cycles, the first thickness, the second thickness, the first period of time, or the second period of time is predetermined.

13. The process of claim 1, wherein contacting comprises pulsing with the aid of a carrier gas.

14. The process of claim 1, wherein the metal source chemical comprises at least one metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os).

15. The process of claim 1, wherein the metal source chemical is selected from the group consisting of metal halides and metal organic compounds.

16. The process of claim 15, wherein the metal source chemical is selected from the group consisting of metal bromides, metal chlorides, metal fluorides and metal iodides.

17. The process of claim 16, wherein the metal source chemical is a tantalum compound selected from the group consisting $TaBr_w$, $TaCl_x$, $TaF_y$, and $TaI_z$, where 'w', 'x', 'y' and 'z' are integers from 1 to 6.

18. The process of claim 1, wherein the one or more plasma-excited reducing species are generated remotely.

19. The process of claim 1, wherein the one or more plasma-excited reducing species are generated in the reaction space.

20. An atomic layer deposition process for forming a thin film on a substrate in a reaction space, comprising in sequence:
   a) depositing a layer of a first thickness by:
      contacting the substrate with a vapor phase pulse of a metal source chemical;
      removing excess metal source chemical from the reaction space;
      contacting the substrate with a gas phase pulse of one or more reducing species during a first period of time; and
      removing excess reducing species and reaction by-products from the reaction space;
   b) repeating step a) for a first number of cycles until the layer of the first thickness is formed;
   c) contacting the substrate with a vapor phase pulse of one or more plasma-excited reducing species during a second period of time, the total second period being not less than twice as long as the total first period of time in which the substrate is contacted with the gas phase pulse of one or more reducing species in step a); and
   d) repeating steps a) through c) for a second number of cycles until a film of a second thickness is formed over the substrate.

21. The process of claim 20, wherein depositing a layer of a first thickness further comprises contacting the substrate with a nitrogen source chemical selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride ($NF_3$), hydroxyl amine ($NH_2OH$) and salts thereof, tert-butylamine ($NH_2C(CH_3)_3$) and salts thereof, allylamine ($NH_2CH_2CHCH_2$) and salts thereof, tertbutylamidi, ammonium fluoride, ammonium chloride, $CH_3N_3$, hydrazine hydrochloride dimethyl hydrazine, hydroxylamine hydrochloride, methylamine, diethylamine, triethylamine and combinations thereof.

22. The process of claim 20, further comprising contacting the substrate with a nitrogen source chemical including one or more plasma-excited species of a nitrogen-containing chemical during the second period of time.

23. The process of claim 22, wherein the nitrogen-containing chemical includes ammonia ($NH_3$).

24. The process of claim 22, wherein the nitrogen-containing chemical includes one or more species of $N_2$ and $H_2$.

25. The process of claim 20, wherein the second period is not shorter than about two seconds.

26. The process of claim 20, wherein the second period is at least about four times as long as the first period.

27. The process of claim 20, wherein the second thickness is at least about six times greater than the first thickness.

28. The process of claim 20, wherein the first number of cycles is greater than ten.

29. The process of claim 20, wherein the reaction space is located within a plasma-enhanced atomic layer deposition (PEALD) reactor.

30. The process of claim 20, wherein removing comprises purging with the aid of a purge gas.

31. The process of claim 30, wherein the purge gas is selected from the group consisting of hydrogen ($H_2$), helium (He), and argon (Ar).

32. The process of claim 20, wherein removing comprises applying a vacuum via a pumping system.

33. An atomic layer deposition process for forming a metal nitride film on a substrate in a reaction space, comprising the sequential steps of:
   a) contacting the substrate with a vapor-phase pulse of a metal source chemical;
   b) contacting the substrate with a vapor phase pulse of one of a reducing agent and a first nitrogen source chemical;
   c) contacting the substrate with a vapor phase pulse of the other of the reducing agent and the nitrogen source chemical; and
   d) repeating steps a) through c) for a first number of cycles until a first thickness of between a fraction of an angstrom and one hundred angstroms of material is deposited since either the ALD process began or an annealing step occurred;
   e) contacting the substrate with a vapor phase pulse of one or more plasma-excited reducing agent and a second nitrogen source chemical for a second period of time; and
   f) repeating steps a) through e) for a second number of cycles until a metal nitride thin film of a second thickness is formed over the substrate,
   wherein the total second period of time in step e) is at least about twice as long as the total first period of time the substrate is contacted with the reducing agent in step b) or c).

34. The process of claim 33, further comprising removing the metal source chemical, reducing agent, or first nitrogen source chemical, and any reaction by-products, after each of said vapor phase pulses.

35. The process of claim 33, wherein the first nitrogen source chemical and the second nitrogen source chemical are the same.

36. The process of claim 33, wherein the reducing agent comprises one or more plasma-excited species of hydrogen.

37. The process of claim 33, wherein the first nitrogen source chemical comprises ammonia ($NH_3$).

* * * * *